US006614676B2

(12) United States Patent
Kaganoi

(10) Patent No.: US 6,614,676 B2
(45) Date of Patent: Sep. 2, 2003

(54) CONTENT-ADDRESSABLE MEMORY DEVICE

(75) Inventor: Teruo Kaganoi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/245,277

(22) Filed: Sep. 18, 2002

(65) Prior Publication Data

US 2003/0053325 A1 Mar. 20, 2003

(30) Foreign Application Priority Data

Sep. 18, 2001 (JP) ....................................... 2001-282755

(51) Int. Cl.[7] .............................................. G11C 15/00
(52) U.S. Cl. ....................................................... 365/49
(58) Field of Search ............................................. 365/49

(56) References Cited

U.S. PATENT DOCUMENTS

| 4,168,541 | A | * | 9/1979 | DeKarske | 365/49 |
| 5,978,245 | A | * | 11/1999 | Hata et al. | 365/49 |
| 6,381,673 | B1 | * | 4/2002 | Srinivasan et al. | 365/49 |
| 6,385,072 | B1 | * | 5/2002 | Yoneda | 365/49 |

* cited by examiner

Primary Examiner—Trong Phan
(74) Attorney, Agent, or Firm—Young & Thompson

(57) ABSTRACT

A content-addressable memory device with multiple WORD lines has: a first memory block to store whether there is a hit during current time period; a second memory block to store whether there is a hit during a period preceding the current time period, the first and second memory blocks being provided for each WORD line; and elements for selecting a WORD line to determine a WORD line to be aged out according to values stored in the first and second memory blocks.

10 Claims, 8 Drawing Sheets

CONTENT-ADDRESSABLE MEMORY DEVICE

FIELD OF THE INVENTION

The present invention relates to memory caching, in particular, to delete information with a low access frequency from a cache memory to secure an available space in the cache memory, so called "aging process" for deleting aged-out entries.

BACKGROUND OF THE INVENTION

"Caching" is a technique of improving the data access speed by transferring frequently used information from a main memory (=inexpensive, vast free memory capacity at low speed) to a cache memory (=high speed, but expensive and very limited in free memory capacity) and storing the information in the cache memory. Caching is generally utilized in routing entries in computers and routers.

Aged out entries are processed to effectively use the cache memory. During the process, data having low frequency of use is removed from an entry register. Decision as to whether the concerned frequency is high or low results from checking the hit history for every entry and retrieving an entry having no hit after a certain amount of time elapses, i.e., an entry that has aged out. Hereinafter, this history check is referred to as the "entry check".

Conventional entry checks have been performed by software. This caused the problem of a heavy load imposed on a processor to run the software. Furthermore, it was difficult to raise the speed because of the software execution.

SUMMARY OF THE INVENTION

It is an object of the invention to provide a content-addressable memory device equipped with hardware to perform entry checks.

According to the invention, a content-addressable memory device with multiple WORD lines comprises:

a first memory block to store whether there is a hit during current time period;

a second memory block to store whether there is a hit during a period preceding the current time period, the first and second memory blocks being provided for each WORD line; and means for selecting a WORD line to determine a WORD line to be aged out based on a value stored in the first and second memory blocks.

DESCRIPTION OF PREFERRED EMBODIMENTS

1. The First Embodiment

Figure 1:
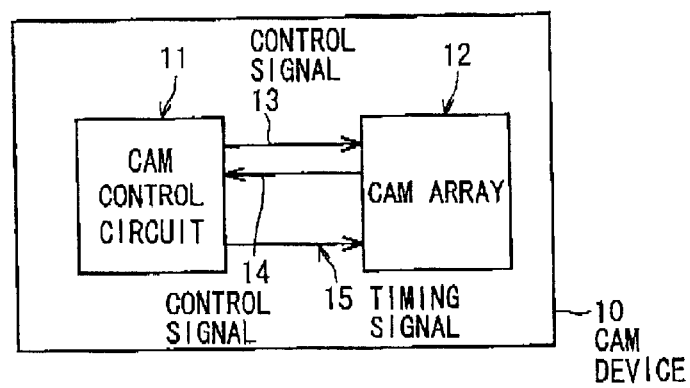
FIG. 1 is a diagram describing the content-addressable memory device 10 of the first embodiment of the present invention.

Hereinafter, content-addressable memory device 10, which is a first embodiment of the present invention, will be described. As shown in FIG. 1, the content-addressable memory device 10 includes a CAM (content addressable memory) control circuit 11 and a CAM array 12. The CAM control circuit 11 and the CAM array 12 exchange control signals 13 and 14 and a timing signal 15. The CAM control circuit 11 generates the control signal 13 for controlling the CAM array 12, transmits the control signal 13 to the CAM array 12, and receives the control signal 14 from the CAM array 12. In addition, the CAM control circuit 11 generates the timing signal 15 to control the timing for the WORD lines to be aged out, and transmits the timing signal 15 to the CAM array 12. The timing signal 15 is a [High] timing pulse generated for every predetermined aging period.

Figure 2:
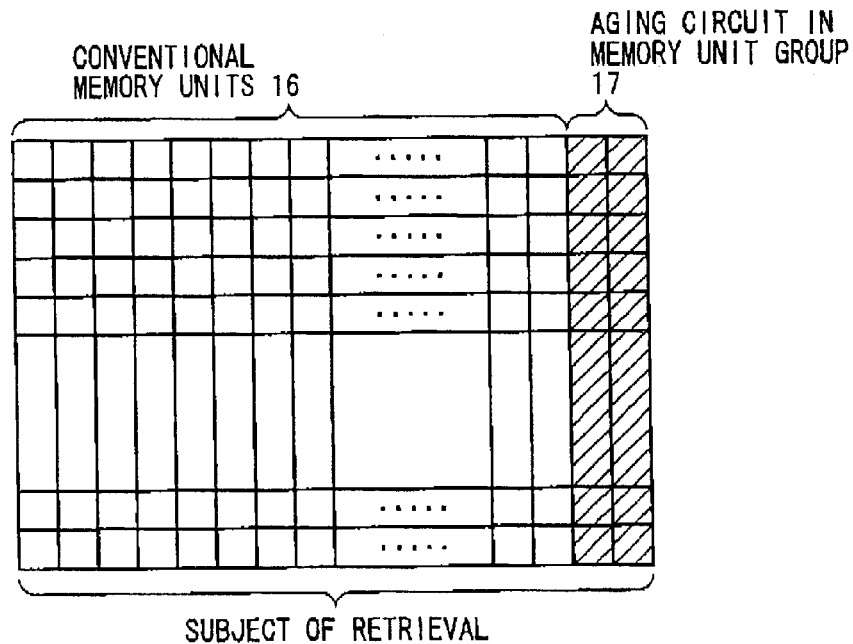
FIG. 2 is a diagram depicting memory units that form the CAM array 12.

The CAM array 12 will now be described with reference to FIG. 2. The CAM array 12 includes an aging circuit in memory cell group 17 described later in addition to typical memory units 16 for every WORD instance. In the CAM array 12, not only the memory units 16 but also the aging circuit in memory unit group 17 can be made a subject of retrieval. At the time of retrieval the data mask determines whether or not these elements become the subject of retrieval.

Figure 3:
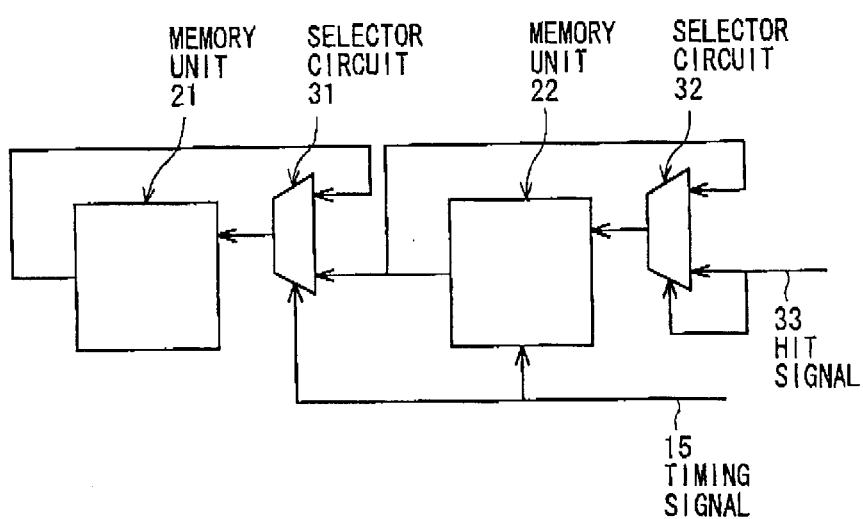
FIG. 3 is a block diagram describing the aging circuit in the memory unit group 17 as it relates to the first embodiment of the present invention.

The aging circuit in memory unit group 17 will now be described with reference to FIG. 3. Selectors 31 and 32 are connected to memory units 21 and 22, respectively.

Output of the selector circuit 31 is preserved in the memory unit 21. The selector circuit 31 is a circuit for selecting either an output of the memory unit 21 or the memory unit 22, the switchover being controlled by the timing signal 15. Selector 31 selects an output of the memory unit 22 when timing signal 15 generates the "[High]" pulse, in all other instances the output of the memory unit 21 will be selected.

Output of the selector circuit 32 is preserved in the memory unit 22. The selector circuit 32 is a circuit for selecting either an output of the memory unit 22 or a "hit" signal 33, the switchover being controlled by the hit signal 33. "Hit" signal 33 is a circuit generating the "High" pulse when a WORD line in question is hit at the time of retrieval in the CAM array 12. Therefore, the selector circuit 32 selects the "Hit" signal 33 when the concerned WORD line is hit at the time of retrieval. Further, since the memory unit 22 has a reset function, it is reset to "Low" when the timing signal 15 has set it to "High".

The content-addressable memory device 10, has a retrieval "hit" or "miss" for the WORD line in question stored for every time interval, as determined by the timing signal 15. The memory unit 22 stores whether there is a retrieval hit in a current interval while the memory unit 21 stores whether there is a retrieval hit in an interval immediately preceding it.

Figure 4:
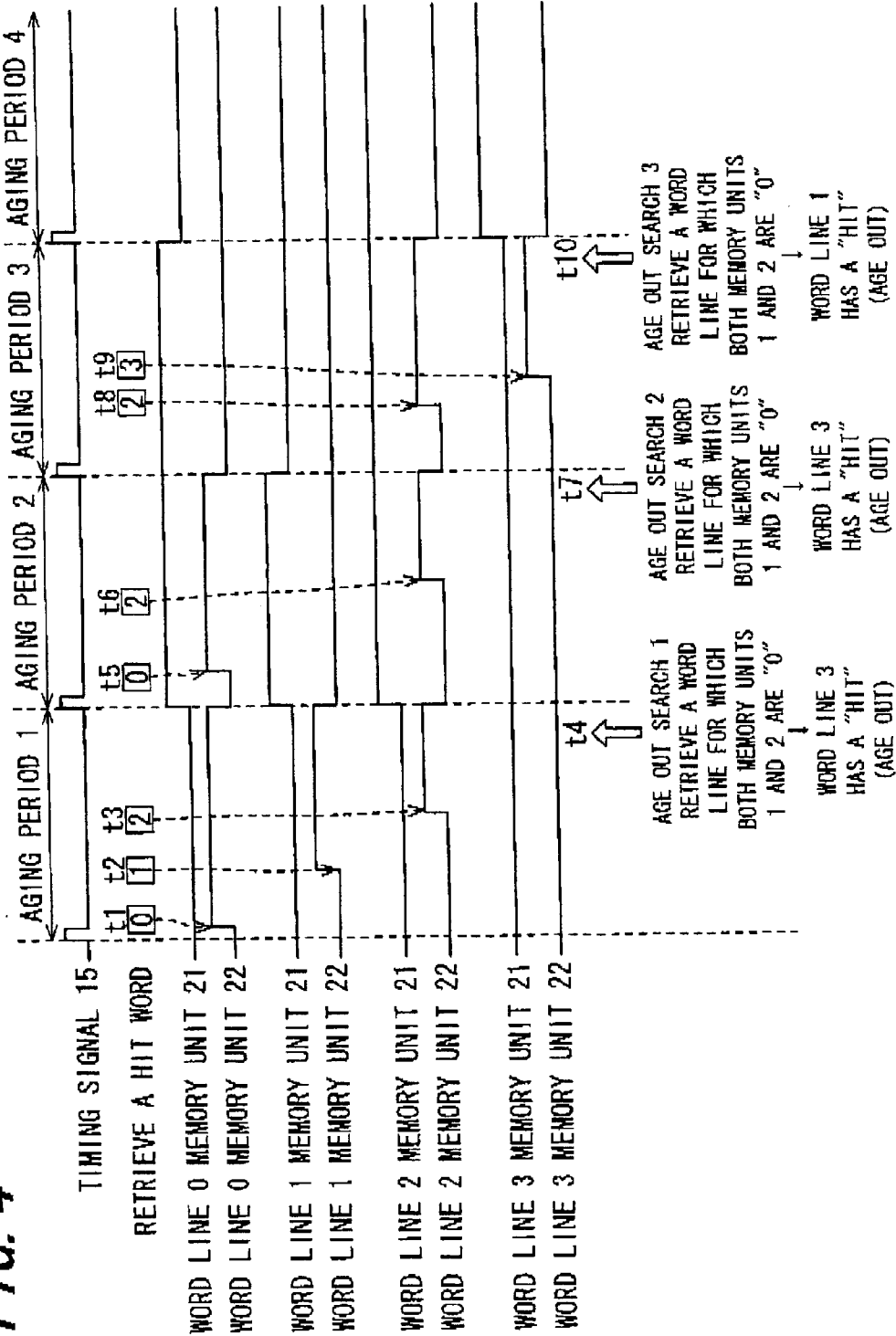
FIG. 4 is a timing chart describing operation of the first embodiment of the present invention.

Operation of the content-addressable memory device 10 will now be described in detail with reference to FIG. 4. For brevity of description, it is now supposed that the CAM array 12 has a total of four WORD lines: lines 0 to 3. As described above, the aging circuit in memory unit group 17 is provided for each of the four WORD lines, with every WORD line on FIG. 4 having memory units 21 and 22 assigned (WORD line 0—memory units 21 and 22, WORD line 1—memory units 21 and 22, WORD line 2—memory units 21 and 22, and WORD line 3—memory units 21 and 22). Time intervals as flagged by the timing signal 15 are referred to (in the order of occurrence) as aging periods 1 to 4.

Immediately before the aging period 1, the memory units 21 and 22 are set to "Low" for all WORD lines.

It is now supposed that in the aging period 1 WORD lines 0, 1 and 2 are hit in the cited order as a result of retrieval. At this time, the status in memory unit 22 of the WORD line 0, the memory unit 22 of the WORD line 1, and the memory unit 22 of the WORD line 2, changes from "Low" to "High" in the cited order (respectively at t1, t2 and t3). To find an entry which is aged out in the last stage (t4) of the aging period 1, an entry with both, the memory units 21 and 22, set to "Low" should be searched for. Both memory units set to "Low" means that there has been no retrieval hit for the concerned WORD line between the immediately preceding aging period and the current aging period. Here, the concerned WORD line is WORD line 3. Thus, the WORD line 3 is handled as the WORD line that has aged out expired.

When the aging period 2 begins, the timing signal 15 generates "High" pulse, memory units 22 of the WORD lines 0, 1 and 2 having "High" as their output provide input to the memory units 21 of respective WORD lines; once the input is complete, the corresponding memory units 22 are reset to "Low". As for the WORD line 3, the memory unit 22 is originally set at "LOW", so consequently neither the memory unit 21, nor the memory unit 22 changes its value. It is now supposed that during the aging period 2 WORD lines 0 and 2 are hit in the cited order as a result of retrieval. At the time of a hit, the memory unit 22 of WORD line 0 and the memory unit 22 of the WORD line 2 change from "Low" to "High" in the cited order (respectively at t5 and t6). An entry that has aged out is searched for in the last stage (t7) of the aging period 2, and the WORD line 3 becomes the applicable WORD instance once again.

When the aging period 3 begins, the timing signal 15 becomes high. At the time, the memory unit 21 of WORD line 0 is set to "High", the memory unit 22 of WORD line 0—"Low", the memory unit 21 of WORD line 1 is set to "High", the memory unit 22 of WORD line 1—"Low", the memory unit 21 of WORD line 2 is set to "High", the memory unit 22 of WORD line 2—"Low". It is now supposed that in the aging period 3 WORD lines 2 and 3 are hit in the cited order. At the time, the status of memory units 22 of WORD lines 2 and 3 changes from "Low" to "High" in the cited order (respectively at t8 and t9). An entry that has aged out is searched for in the last stage (t10) of the aging period 3, and the WORD line 1 becomes the subject WORD line here.

Thus the content-addressable memory device 10 allows for a search to be performed in the CAM array 12 to retrieve an entry that has not been hit at any time within either, the current or the immediately preceding aging period. Defining such an entry as an entry that has aged out allows for the aging out to be executed at high speed by hardware.

2. The Second Embodiment

The features of the second embodiment of the present invention will now be described. The first embodiment has aged out entries searched for on the last stage of every aging period. The characteristic feature of the second embodiment, on the other hand, allows for an entry that has aged out to be searched for at any, randomly selected, point in time. Following the design of this device, such a search may be performed only when handling of an aged out entry is necessary, for example—when new data needs to be entered to CAM array 12 and there is no space available. Such an application provides for improved efficiency in utilization of the CAM array 12, and allows to conserve free space.

Figure 5:
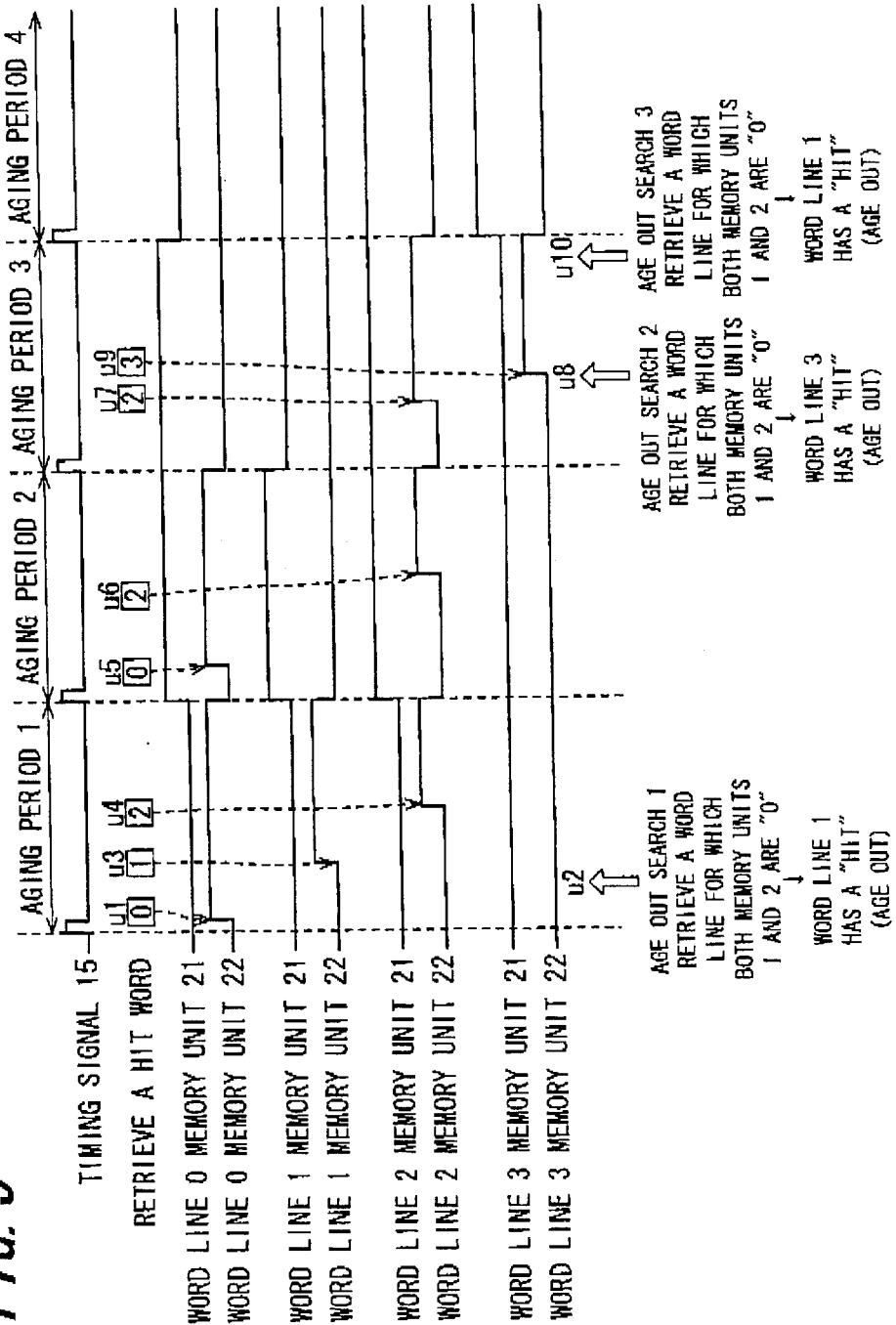
FIG. 5 is a timing chart describing operation of the second embodiment of the present invention.

Referring to FIG. 5 for example, WORD lines 0, 1 and 2 are hit in the cited order in the aging period 1 (u1, u3 and u4). Here, the search for an entry that has aged out is performed between u1 and u3, as opposed to being performed at the last stage of the aging period 1, WORD instances for which both the memory units 21 and 22 are set to "Low" at the time u2 are WORD lines 1, 2 and 3. No search is performed for an entry that has aged out during aging period 2, the search is conducted twice, however, for the aging period 3 (u8 and u10). At the time u8, the WORD lines 1 and 3 contain entries that have aged out. At u9, however, the WORD line 3 is hit, so that when a search is initiated at u10, only the WORD line 1 will return an entry that has aged out.

3. The Third Embodiment

The first embodiment has a "hit" or "miss" occurrence stored for the two, the current and immediately preceding, aging periods. The third embodiment, on the other hand, has a "hit" or "miss" occurrence stored for three, the current, immediately preceding, and the one before aging periods is stored. The third embodiment, therefore, has the aging circuit in memory unit group 17 including three memory units for each WORD line of the CAM array 12.

Figure 6:
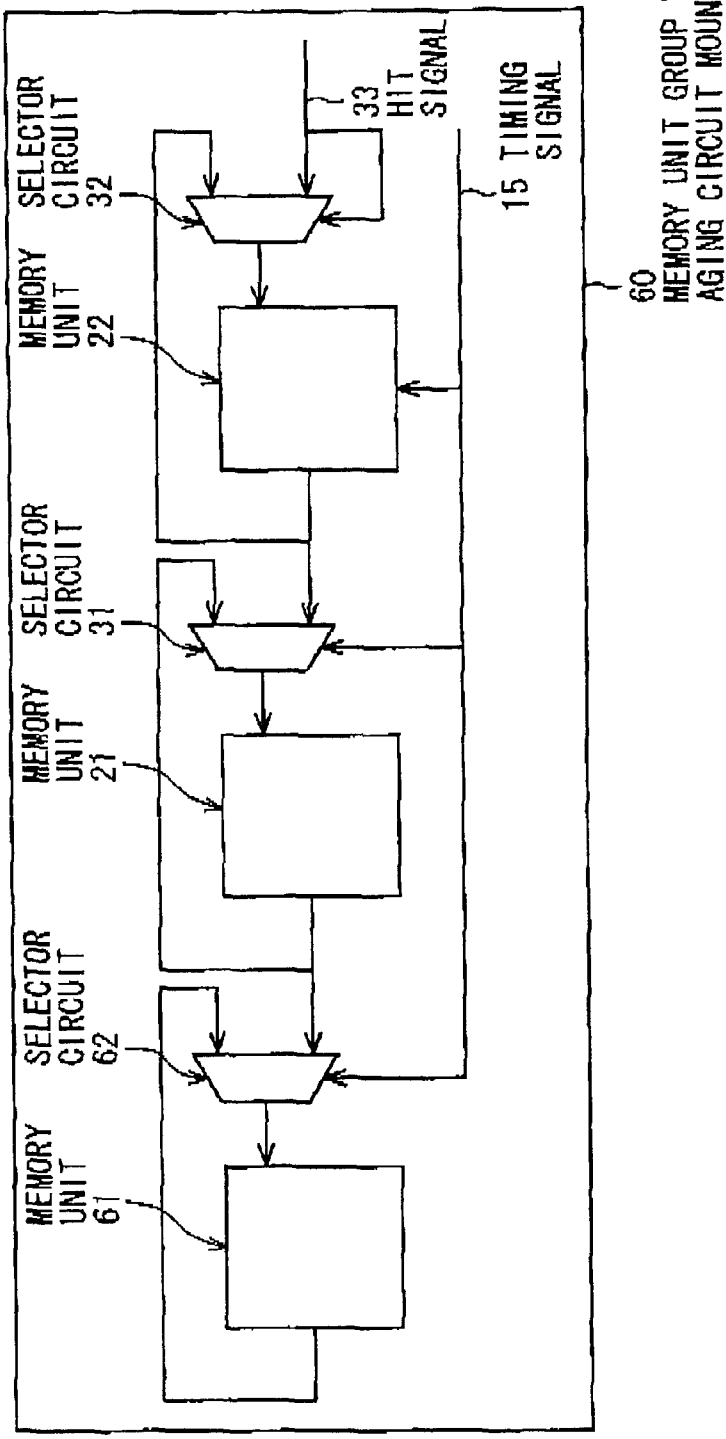
FIG. 6 is a block diagram describing the aging circuit in the memory unit group 60 as it relates to the third embodiment of the present invention.

The third embodiment has aging circuit in memory unit group 60 provided for each WORD line of the CAM array 12 as shown in FIG. 6. Elements, corresponding to those of the first embodiment, are denoted by similar reference characters. With regard to characteristic features of the third embodiment distinguishing it from the first embodiment, a memory unit 61 and a selector circuit 62 are provided in addition to the circuit described on FIG. 3. An output of the memory unit 21 is the input of the selector circuit 62. An output of the selector circuit 62 is then the input of the memory unit 61. The selector circuit 62 is a circuit for selecting either an output of the memory unit 21 or an output of the memory unit 61 with the switchover controlled by the timing signal 15. The selector circuit 62 selects the output of the memory unit 21 when the timing signal 15 generates "High" pulse; otherwise it selects the output of the memory unit 61. In other words, the value of the memory unit 22 is transferred to the memory unit 21, the value of the memory unit 21—to the memory unit 61 when the timing signal 15 generates "High" pulse.

Operation of the present embodiment will now be described. In the first and the second embodiments, the WORD instances having both the memory units 21 and 22 set to "Low" are searched for. It can also be maintained that WORD instances having two or more memory units set to "Low" are searched for. In the third embodiment, on the other hand, two kinds of search can be conducted: a search having all memory units (21, 22 and 61) set to "LOW" as a retrieval criterion, and a search having the memory units 21 and 22 set to "Low" as a retrieval key (irrespective of the value of the memory unit 61). If three memory units are thus provided as the memory unit group incorporating the aging circuit for every WORD line, the hit history corresponding to three occurrences can be preserved. Therefore multiple retrieval criteria can be utilized to retrieve entries that have aged out.

Using the retrieval criteria efficiently, for example since now it is possible to use the retrieval criteria to satisfy a sudden requirement of free memory, the CAM array 12 can be utilized more efficiently. If the number of memory units of the memory unit group incorporating aging circuit increases to four or more, then the criteria can be further expanded as becomes apparent to those skilled in the art.

Figure 7:
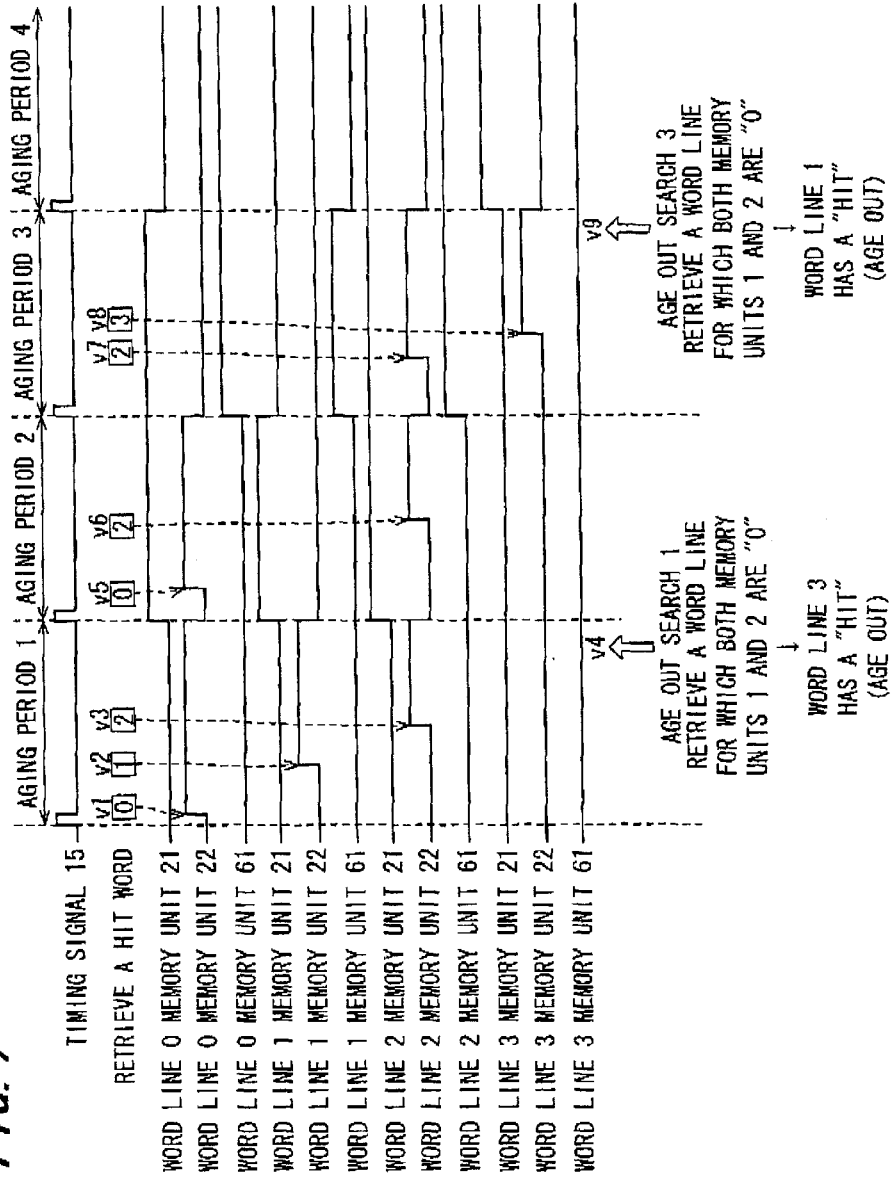
FIG. 7 is a timing chart describing operation of the third embodiment of the present invention.

The constituents will now be described with reference to FIG. 7. Retrieval of an entry that has aged out at v4 is conducted using the condition of all of memory units 21, 22 and 61 being set to "Low" as a retrieval criterion. A WORD line that satisfies this criterion is WORD line 3. Retrieval of an entry that has aged out at v9 is conducted using the condition of only the memory units 21 and 22 being set to "Low" as a retrieval criterion. Here, the WORD line 1 is hit. Note that a WORD line satisfying the condition would not exist if the condition of all memory units being set to "Low" were used as the retrieval criterion at v9.

4. The Fourth Embodiment

Figure 8:
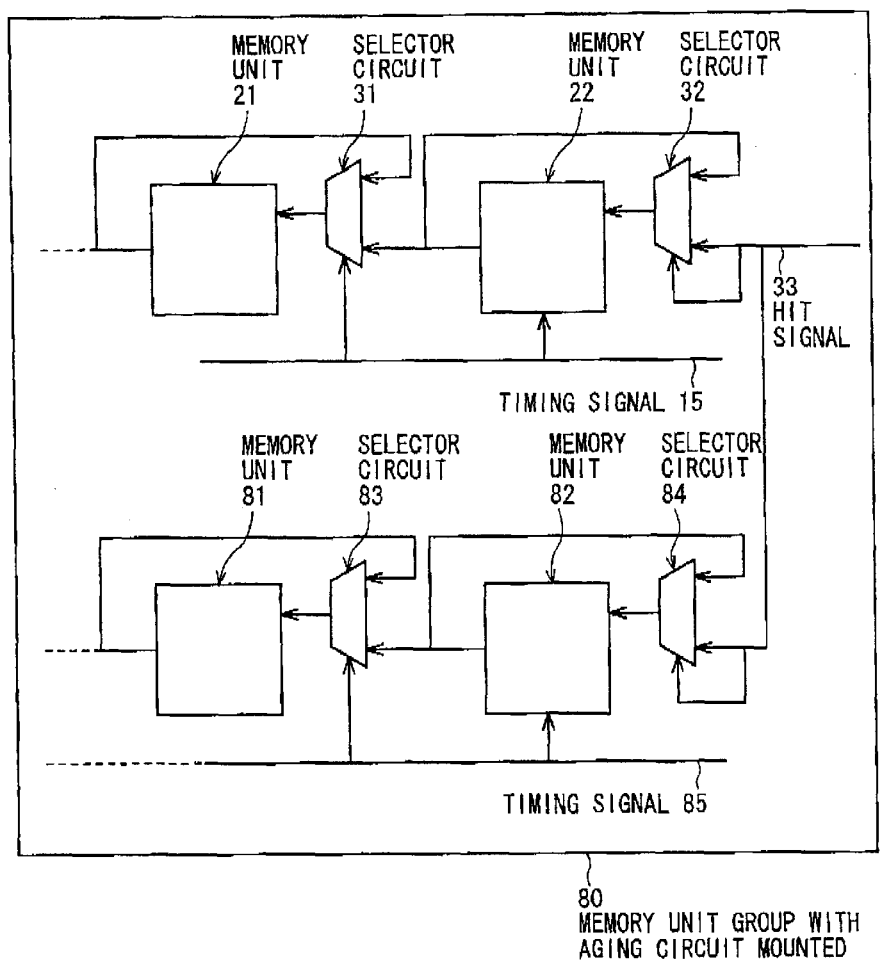
FIG. 8 is a block diagram describing the aging circuit in the memory unit group 80 as it relates to the fourth embodiment of the present invention.

The fourth embodiment has CAM array 12 comprising two sets of aging circuits in memory unit group 17 of the first embodiment for every WORD line. The fourth embodiment has memory units 81 and 82, together with selector circuits 83 and 84 provided in addition to the memory units 21 and 22 and the selector circuits 31 and 32 as shown in FIG. 8. The memory units 81 and 82 are equivalent to the memory units 21 and 22, respectively. In the same way, the selector circuits 83 and 84 are equivalent to the selector circuits 31 and 32.

Hereinafter, the memory units 21 and 22 shall be referred to as the first set (including also selector circuits 31 and 32), and the memory units 81 and 82 shall be referred to as the second set (including also selector circuits 83 and 84). To determine whether there is a hit for a WORD line in question, an identical hit signal 33 generates a signal supplied to both, the first and the second set. Different timing signals, however, from signals 15 and 85 are supplied to the first set and the second set respectively to determine the period of aging. The timing signals 15 and 85 each generate independent signals.

Thus, using multiple sets operating through signals each having independent period counting, it becomes possible to retrieve an entry that has aged out on the basis of multiple aging periods. As opposed to the third embodiment, where a plurality of aging periods can be set, each comprising an integral multiple of the signal sent by timing signal 15, the fourth embodiment allows for multiple aging periods to be set irrespective of the period set by timing signal 15.

It shall become apparent for those skilled in the art that the third embodiment can be implemented in the fourth embodiment. That is, in the example above, each of the sets has two pairs of elements, each pair comprising a memory unit and a selector circuit. If number of coupled elements is increased to three or four, instead of two pairs, then multiple aging periods, each being an integral multiple of the period as flagged by the timing signal 15 or 85, can be set for each of the sets.

5. The Fifth Embodiment

Figure 9:
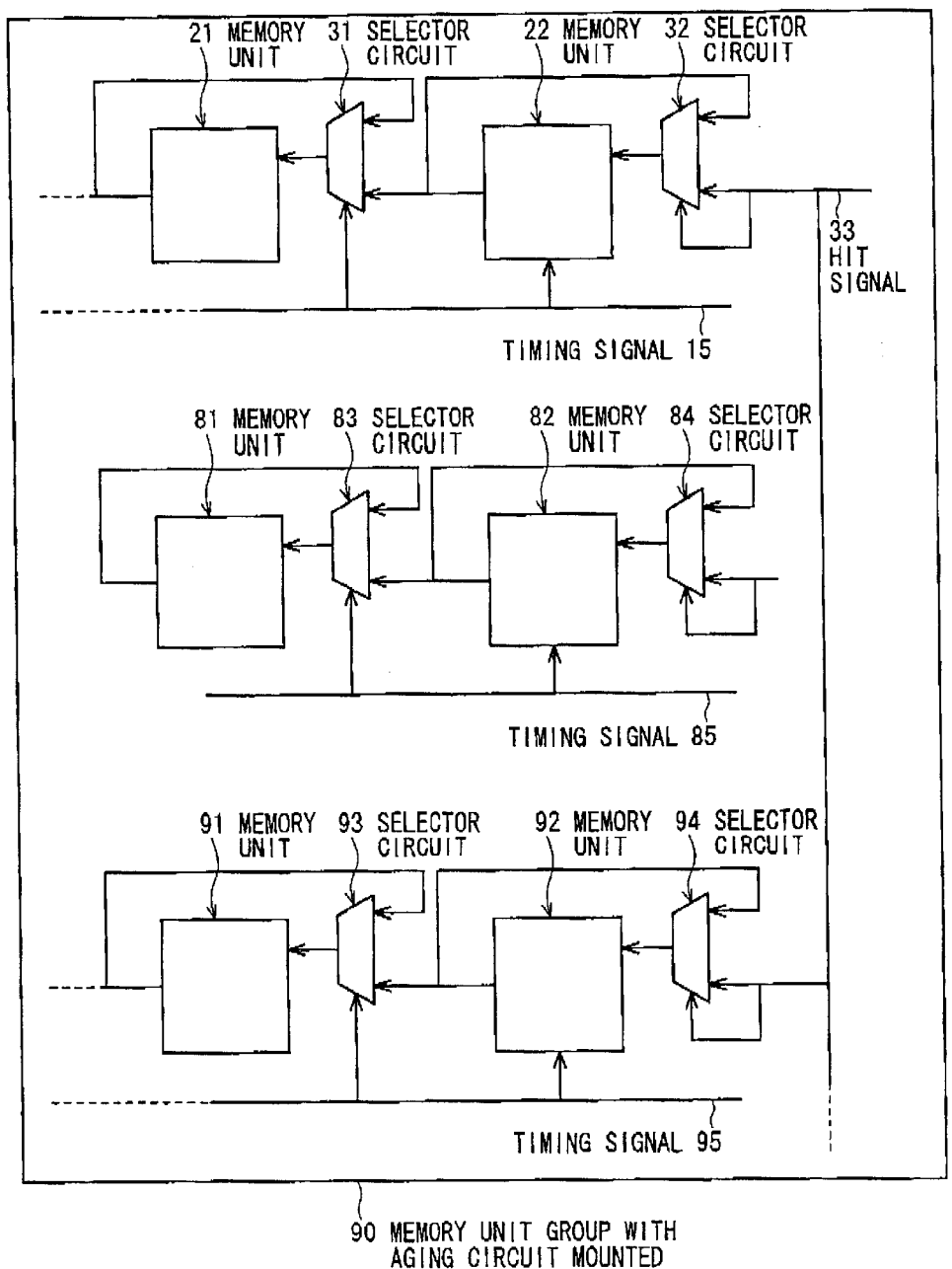
FIG. 9 is a block diagram describing the aging circuit in the memory unit group 90 as it relates to the fifth embodiment of the present invention.

The fifth embodiment has a third set provided in addition to the first set and the second set described in the fourth embodiment. Referring to the description of FIG. 9, each of the WORD lines in the CAM array 12 has further memory units 91 and 92 with selector circuits 93 and 94 as the third set in addition to the memory units and the selector circuits as described in the fourth embodiment. The third set is supplied with a signal generated by a timing signal 95, so the signals 15, 85 and 95 have each independent period counting.

Providing three or more sets shall therefore, allow an entry that has aged out to be retrieved on the basis of three or more independent aging periods.

Heretofore, the present invention has been described on the basis of the embodiments, it is, however, not limited to those applications alone. Changes and improvements are possible within the range of common knowledge for those experienced in the art.

The present invention allows, by supplying only a timing signal from the outside, for a necessary item of information to be retrieved in the CAM in order to find an entry that was "missed" within a specified period of time up to now. Using a BIT line with the aging circuit to define retrieval criteria allows for a search for the aged out entries (entry check) to be performed periodically. This type of architecture allows the handling to be performed by hardware, so that the use of software for that purpose becomes unnecessary.

Because of that, as compared to the prior art with a search for an aged out entry performed by software, the time required for the search can be reduced drastically. Furthermore, since software is not required to control the entry check, the load on the processing capability of hardware can be reduced.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching herein set forth.

What is claimed is:

1. A content-addressable memory device with multiple WORD lines, comprising:
   a first memory block to store whether there is a hit during current time period;
   a second memory block to store whether there is a hit during a period preceding the current time period, said first and second memory blocks being provided for each WORD line; and
   means for selecting a WORD line to determine a WORD line to be aged out based on a value stored in the first and second memory blocks.

2. The content-addressable memory device according to claim 1, wherein said second memory block comprises two or more memory units for storing whether there is a hit in two or more preceding periods, respectively.

3. The content-addressable memory device according to claim 1, wherein said WORD line selecting means determines that, if both of the first and second memory blocks for a WORD line store a value indicating that there is no hit, the WORD line is to be aged out.

4. The content-addressable memory device according to claim 2, wherein said WORD line selecting means determines that, if a number of a value, which is stored in the first and the second memory blocks for a WORD line to indicate that there is no hit, exceeds a predetermined threshold value, the WORD line is to be aged out.

5. The content-addressable memory device according to claim 4, comprising a plurality of the WORD line selecting means, each of which has a different threshold value.

6. The content-addressable memory device according to claim 1, further comprising means for supplying a signal indicating a section point of the time period.

7. The content-addressable memory device according to claim 6, wherein said signal is provided with a predetermined cycle.

8. The content-addressable memory device according to claim 6, comprising a plurality of said signal supplying means each of which supplies a signal independent of each other.

9. The content-addressable memory device according to claim 8, comprising a plurality of sets of the first and the second memory blocks for each WORD line, wherein each of said signal supplying means supplies an independent signal to each of said plurality of sets.

10. The content-addressable memory device according to claim 2, wherein said WORD line selecting means determines that, if both of the first and second memory blocks for a WORD line store a value indicating that there is no hit, the WORD line is to be aged out.

* * * * *